US010266783B2

(12) United States Patent
Lee et al.

(10) Patent No.: US 10,266,783 B2
(45) Date of Patent: Apr. 23, 2019

(54) LOW FRICTION MEMBER HAVING SEAWEED-TYPE NANOTUBES AND METHOD FOR PRODUCING SAME

(71) Applicant: Industry-University Cooperation Foundation Sunmoon University, Chungcheongnam-do (KR)

(72) Inventors: Soo Wohn Lee, Chungcheongnam-do (KR); Seung Ho Kim, Chungchongnam-do (KR); Tae Ho Kim, Chungcheongnam-do (KR); Sang Hoon Jeong, Chuncheongnam-do (KR); Jin Hyuk Choi, Chungcheongnam-do (KR)

(73) Assignee: Industry-University Cooperation Foundation Sunmoon University, Chungcheohgnam-do (KR)

( * ) Notice: Subject to any disclaimer, the term of this patent is extended or adjusted under 35 U.S.C. 154(b) by 0 days.

(21) Appl. No.: 15/543,149

(22) PCT Filed: Oct. 12, 2015

(86) PCT No.: PCT/KR2015/010739
§ 371 (c)(1),
(2) Date: Jul. 12, 2017

(87) PCT Pub. No.: WO2016/117799
PCT Pub. Date: Jul. 28, 2016

(65) Prior Publication Data
US 2018/0002627 A1 Jan. 4, 2018

(30) Foreign Application Priority Data
Jan. 23, 2015 (KR) .................. 10-2015-0011454

(51) Int. Cl.
*B05D 3/00* (2006.01)
*B05D 7/24* (2006.01)
(Continued)

(52) U.S. Cl.
CPC .......... *C10M 103/04* (2013.01); *B05D 3/007* (2013.01); *B05D 7/24* (2013.01); *B32B 33/00* (2013.01);
(Continued)

(58) Field of Classification Search
CPC .......... B32B 33/00; B05D 3/007; B05D 7/24; B05D 5/08; C23C 16/4417; C23C 22/00;
(Continued)

(56) References Cited

U.S. PATENT DOCUMENTS

2010/0173228 A1* 7/2010 Wallace ............... H01M 4/8605
429/532

FOREIGN PATENT DOCUMENTS

JP 2008195781 8/2008
JP 2009190155 8/2009
(Continued)

*Primary Examiner* — Vishal V Vasisth
(74) *Attorney, Agent, or Firm* — Cesari and McKenna, LLP (57) ABSTRACT

The present invention relates to a low friction member having seaweed-type nanotubes, the nanotubes which protrude like seaweed on the surface of a base material being concentrated in the moving direction of a sliding member, thereby improving the fluidity of a liquid lubricant, thus enabling the effective reduction of surface friction.

Such present invention comprises: a base material which has a plurality of dimples formed on the surface thereof so as to reduce friction occurring due to the surface contact of a sliding member; a fixing material which is filled inside the dimples; nanotubes which are buried in the fixing material and protrude to the outside by means of the surface pro- (Continued)

cessing of the fixing material; and a liquid lubricant which is coated on the surface of the base material, wherein, as the protruding nanotubes become concentrated in the moving direction of the sliding member, the fluidity of the liquid lubricant is improved, thereby enabling the effective reduction of surface friction.

11 Claims, 11 Drawing Sheets

(51) Int. Cl.
*B32B 33/00* (2006.01)
*C23C 16/44* (2006.01)
*C23C 22/00* (2006.01)
*F16C 33/10* (2006.01)
*C10M 103/02* (2006.01)
*C10M 103/04* (2006.01)
*C10M 125/02* (2006.01)
*C10M 125/28* (2006.01)
*C10M 177/00* (2006.01)
*B05D 5/08* (2006.01)

(52) U.S. Cl.
CPC ........ *C10M 103/02* (2013.01); *C10M 125/02* (2013.01); *C10M 125/28* (2013.01); *C10M 177/00* (2013.01); *C23C 16/4417* (2013.01); *C23C 22/00* (2013.01); *F16C 33/1095* (2013.01); *B05D 5/08* (2013.01); *C10M 2201/041* (2013.01); *C10M 2201/05* (2013.01); *C10M 2201/12* (2013.01); *C10N 2230/06* (2013.01); *C10N 2250/08* (2013.01); *C10N 2250/121* (2013.01); *F16C 33/1065* (2013.01); *Y02T 10/865* (2013.01)

(58) Field of Classification Search
CPC .............. F16C 33/10; C10N 2250/121; C10N 2250/08; C10N 2230/06; Y02T 10/865; C10M 2201/12; C10M 2201/05; C10M 2201/041
USPC ........................................................ 508/105
See application file for complete search history.

(56) References Cited

FOREIGN PATENT DOCUMENTS

| | | |
|---|---|---|
| JP | 2013147378 | 8/2013 |
| KR | 10-20110048545 | 5/2011 |
| KR | 10-20140043960 | 4/2014 |
| KR | 20140039661 | 4/2014 |

* cited by examiner

LOW FRICTION MEMBER HAVING SEAWEED-TYPE NANOTUBES AND METHOD FOR PRODUCING SAME

CROSS REFERENCE TO RELATED APPLICATIONS

This application is the National Stage of International Application No. PCT/KR2015/010739, filed on Oct. 12, 2015, which claims the benefit of Korean Application No. 10-2015-0011454, filed on Jan. 23, 2015. The contents of both applications are hereby incorporated by reference in their entirety.

TECHNICAL FIELD

The present invention relates to a low friction member, and particularly, to a low friction member having seaweed-type nanotubes, the nanotubes which protrude like seaweed on the surface of a base material being concentrated in the moving direction of a sliding member, thereby improving the fluidity of a liquid lubricant, thus enabling the effective reduction of surface friction.

BACKGROUND ART

In an automotive industry, frictional characteristics of many engine parts are crucial for cost reduction due to maintenance, parts replacement and breakage, reduction of investment cost by extending a life-span, and energy saving by reducing friction in addition to energy saving. In particular, the surface morphology in contact with each other wear has a significant impact on friction behaviors in the friction characteristics. In the case of sliding contact in a lubricated state, the frictional characteristics can be improved by the formation of surface irregularities such as a small dimple shape. These irregularities serve as a lubricant reservoir and serves to prevent a lubricant from leaking out. In addition, since abrasive particles can be removed from a contact surface and collected inside a structure, additional abrasion can be prevented, which is caused due to the abrasive particles.

Therefore, in recent years, studies have been conducted by various methods to enhance fuel efficiency and energy loss due to friction in power machine parts by reducing the energy loss due to friction resistance of engine parts and among these methods, in particular, a research into surface texturing has in active progress.

Surface texturing technology represents machining a large number of irregularities such as dimples or grooves on at least one surface of two surfaces in order to improve lubrication between two surfaces that are relatively moving through the lubricant. The irregularities of the surface store the lubricant and promote generation of hydrodynamic pressure by abrasion particle trapping.

In particular, laser surface texturing is mainly used to make patterns in the form of the dimples and as compared with other texturing methods, a process time is extremely fast and the shape and size of the dimples can be controlled by using laser parameters (pulse energy, pulse number) and in the case of research trends of the laser surface texturing, S, Schreck et al. in Germany has researched that performs texturing of channel and dimple types with respect to $Al_2O_3$ and $100Cr_6$ steels by using an Nd:YAG laser and reduce the friction according to their density under lubrication and Izhak Etsion of Israel has experimentally confirmed that a partial pattern is further improved than total patterning using the laser surface texturing in a cylinder ring, which is in direct contact with a cylinder in an internal combustion engine. In addition, Kovalchenko of the Argonne Institute in the United States has suggested that when there is the dimple based on a friction coefficient and the wear scar of the ball according to the dimple density using laser surface texturing (hereinafter, referred to as LST) and the viscosity of the lubricant, the wear rate of the ball was high, but a contact area increases as compared with an initial contact and the transition from boundary lubrication to a mixed lubrication region thus rapidly occurs in a lubricated state, thereby decreasing the friction coefficient.

However, even in the above-mentioned research, it is necessary to develop a new type of low-friction member which improves a low friction effect due to an insufficient low friction effect through the laser surface texturing technology.

Technical Problem

Accordingly, the present invention is contrived to solve all problems in the related art and an object of the present invention is to provide a low friction member having seaweed-type nanotubes, the nanotubes which protrude like seaweed on the surface of a base material being concentrated in the moving direction of a sliding member, thereby improving the fluidity of a liquid lubricant, thus enabling the effective reduction of surface friction.

Technical Solution

In order to achieve the object and a low friction member according to the technical spirit of the present invention includes: a base material which has a plurality of dimples formed on the surface thereof so as to reduce friction occurring due to the surface contact of a sliding member; a fixing material which is filled inside the dimples; nanotubes which are buried in the fixing material and protrude to the outside by means of the surface processing of the fixing material; and a liquid lubricant which is coated on the surface of the base material, wherein, as the protruding nanotubes become concentrated in the moving direction of the sliding member, the fluidity of the liquid lubricant is improved, thereby enabling the effective reduction of surface friction.

Further, a low friction member having seaweed-type nanotubes includes: a base material; a fixing material coated onto the surface of the base material; nanotubes which are distributed onto the surface of the base material while being buried in the fixing material and protrude to the outside by means of surface processing of the fixing material; and a liquid lubricant which is coated on the surface of the base material, wherein as the protruding nanotubes become concentrated in the moving direction of the sliding member, the fluidity of the liquid lubricant is improved, thereby enabling the effective reduction of surface friction.

Herein, fixing material may be formed by melting and thereafter, curing glass powder and the nanotubes may be mixed while being distributed to the glass powder at the time of forming the fixing material.

Meanwhile, a low friction member having seaweed-type nanotubes includes: a base material; a metallic solid lubrication particle which is coated on the surface of the base material; and nanotubes provided to protrude on the surface of the metallic solid lubrication particle.

Herein, multiple dimples may be formed so as to reduce friction which occurs due to the surface contact of a sliding member.

Meanwhile, a method for producing a low friction member includes: mixing low thermal expansive glass powder and nanotubes; distributing and coating the mixed low thermal expansive glass powder and nanotubes onto the surface of a base material; heating and melting, and thereafter, curing the low thermal expansive glass powder covering the surface of the base material to form a fixing material in which the nanotubes are buried; surface-processing the fixing material so that the nanotube buried in the vicinity of the surface of the fixing material protrudes; and coating a liquid lubricant on the surface of the base material.

Herein, a patterned low friction dimple may be formed on the surface of the base material.

Further, the fixing material may be provided to be filled in the dimple.

In addition, the low thermal expansive glass powder and the nanotubes may be coated on the surface of the base material in a type of slurries acquired by mixing the low thermal expansive glass powder and the nanotubes by a wet method, and the low thermal expansive glass powder may be heated at a temperature which belongs to a temperature range of 1300 to 1500° C. for 2 to 10 hours in order to melt the low thermal expansive glass powder and the melted glass powder may be filled in breakage portions which exist on the surface of the base material.

Further, the method for producing a low friction member may further include: primarily melting, cooling, and grinding the low thermal expansive glass powder and the nanotubes; mixing ground powder made through the grinding in ethanol and coating the ground powder on the base material; and heating the low thermal expansive glass powder at a temperature which belongs to a temperature range of 1300 to 1500° C. for 2 to 10 hours in order to secondarily melt the low thermal expansive glass powder to make the melted low thermal expansive glass power form a layer on the surface of the base material while the melted low thermal expansive glass powder is filled in the breakage portions which exist on the surface of the base material.

In addition, a method for producing a low friction member includes: mixing a metallic solid lubrication particle and nanotubes; distributing and coating the mixed metallic solid lubrication particle and nanotubes onto the surface of a base material; performing heat-treatment while the metallic solid lubrication particle and nanotubes are coated on the surface of the base material; and surface-processing the surface of the base material.

Herein, in order to coat the metallic solid lubrication particle and nanotubes on the surface of the base material, slurries including the metallic solid lubrication particle and nanotubes may be provided and ultrasonic waves may be applied while the base material is immersed in the slurries.

Further, in order to coat the metallic solid lubrication particle and nanotubes on the surface of the base material, the slurries including the metallic solid lubrication particle and nanotubes may be provided and ultraviolet rays having a wavelength range of 200 to 400 nm may be irradiated while the base material is immersed in the slurries.

In addition, a method for producing a low friction member includes: distributing and coating metallic solid lubrication particles having a nano size onto the surface of a base material; and growing nanotubes by using the metallic solid lubrication particles as a catalyst by a chemical vapor deposition process.

Herein, a patterned low friction dimple may be formed on the surface of the base material.

Advantageous Effects

In a low friction member having seaweed-type nanotubes, while the nanotubes which protrude like seaweed on the surface of a base material are concentrated in the moving direction of a sliding member, the fluidity of a liquid lubricant is improved, thereby enabling the effective reduction of surface friction.

Further, in the present invention, a further improved friction reduction effect can be expected by a configuration in which glass layers, dimples, and metallic solid lubricating particles are combined together with the seaweed-type nanotubes.

In addition, in the present invention, a large-area low friction member based on a large-area base material can be also be implemented by a process using ultrasonic waves and ultraviolet rays.

MODE FOR INVENTION

A method for producing a low friction member according to an embodiment of the present invention will be described in detail with reference to the accompanying drawings. A method for producing a low friction member according to an embodiment of the present invention will be described in detail with reference to the accompanying drawings. A method for producing a low friction member according to an embodiment of the present invention will be described in detail with reference to the accompanying drawings. In describing each drawing, reference numerals refer to like elements. In the accompanying drawings, the sizes of structures are illustrated while being enlarged as compared with actual sizes for clarity of the present invention or downsized as compared with the actual sizes in order to appreciate a schematic configuration.

Further, terms including as first, second, and the like are used for describing various constituent elements, but the constituent elements are not limited by the terms. The terms are used only to discriminate one constituent element from another component. For example, a first component may be referred to as a second component, and similarly, the second component may be referred to as the first component without departing from the scope of the present invention. Meanwhile, if it is not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

Figure 1:
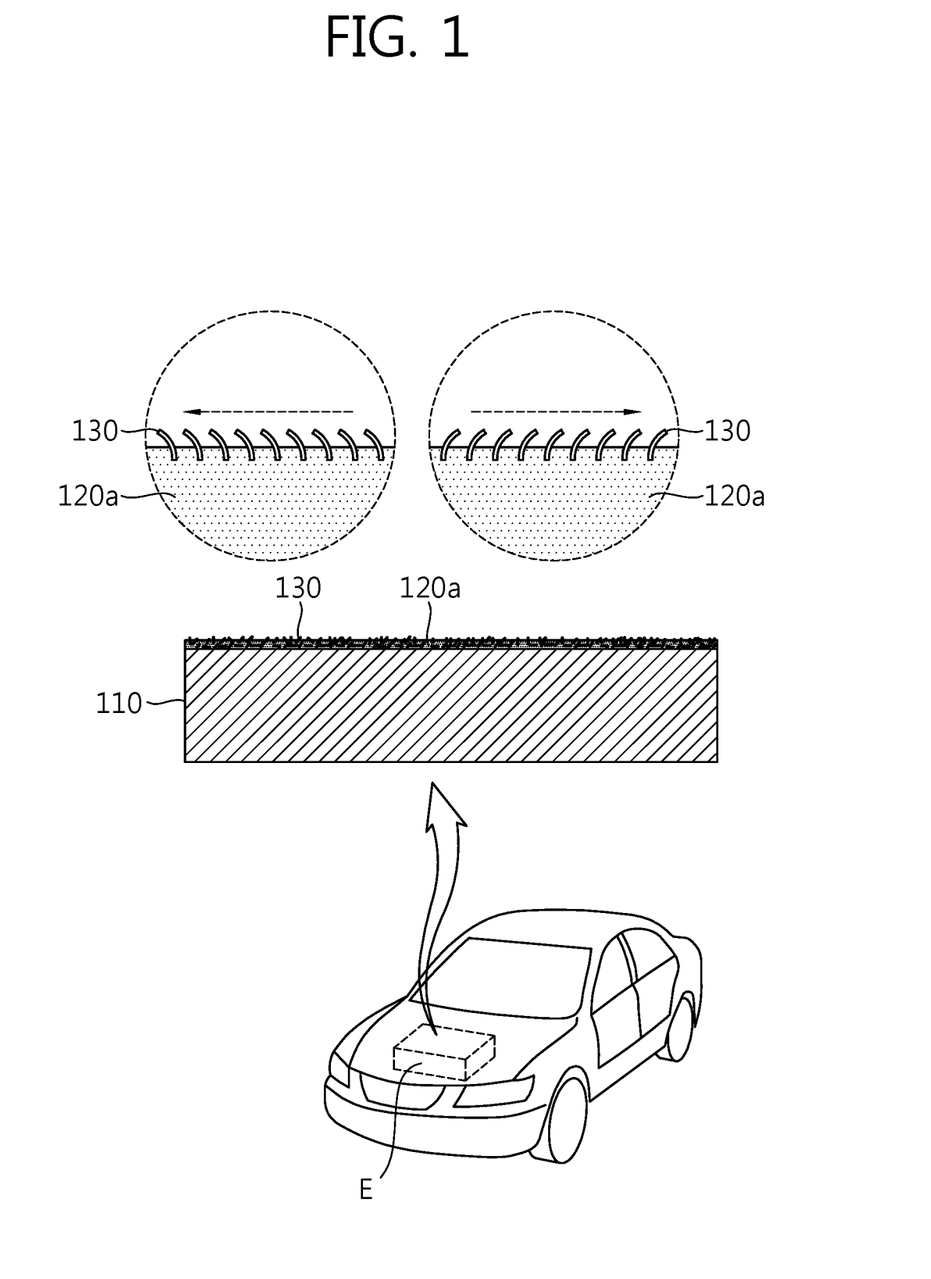
FIG. 1 is a cross-sectional view for describing a configuration of a low friction member according to a first embodiment of the present invention.
Figure 2:
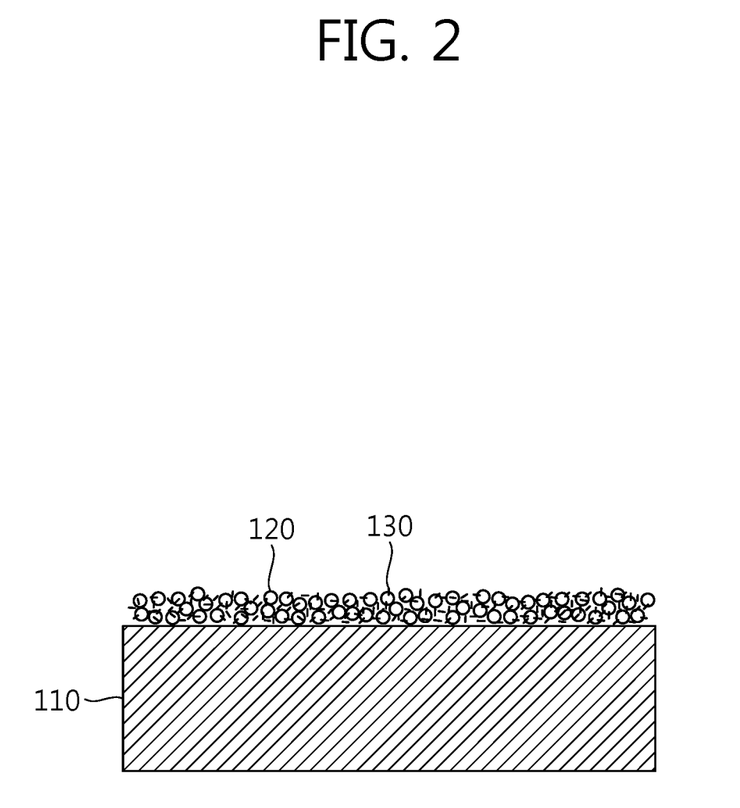
FIGS. 2 to 4 are a series of reference diagrams for describing a method for producing the low friction member according to the first embodiment.
Figure 3:
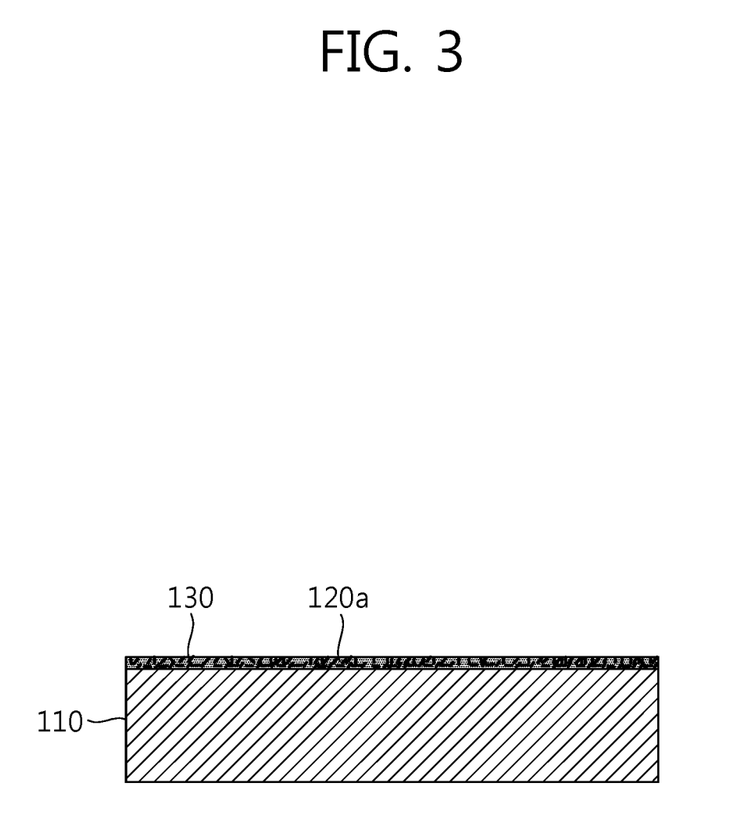

FIG. 1 is a cross-sectional view for describing a configuration of a low friction member according to a first embodiment of the present invention and FIGS. 2 and 3 are a series of reference diagrams for describing a method for producing the low friction member according to the first embodiment.

As illustrated, the low friction member according to the first embodiment of the present invention has an inventive structure in which the nanotubes 130 which protrude like seaweed on the surface of a base material 110 being concentrated in the moving direction of a sliding member, thereby improving the fluidity of a liquid lubricant, thus enabling the effective reduction of surface friction and may be applied to products in which a friction contact occurs due to a contact of the sliding member such as an automobile engine E, etc.

The low friction member according to the embodiment of the present invention has a simple configuration having the base material 110, a fixing material 120a, and the nanotube 130, and a liquid lubricant as primary components.

The base material 110 is made of a material such as metal or ceramics.

The fixing material 120a serves to fix the nanotube 130. To this end, the fixing material 120a is achieved when low thermal expansive glass powder 120 (glass borosilicate and soda borosilicate) powder is melted on the surface of the base material 110 and cured (see FIG. 2) while the low thermal expansive glass powder 120 is mixed with the nanotube 130 (see FIG. 2). A point which may be noted herein is a point that when the low thermal expansive glass powder 120 is melted on the surface of the base material 110, while the low thermal expansive powder 120 permeates porosities and cracked portions which exist on the surface of the base material 110, the surface of the base material 110 is reinforced and a friction coefficient is lowered to serve as a factor which reduces the surface friction.

The nanotube 130 is provided to protrude to the outside from the fixing material 120a coated onto the surface of the base material 110 as illustrated in an enlargement part of FIG. 1. The nanotube 130 serves as if the seaweed to improve the fluidity of the liquid lubricant while being concentrated in the movement direction of the sliding member, thereby enabling the effective reduction of the surface friction. Herein, the nanotube 130 may be provided as CNT and TNT and may also be provided nanorod. Further, in order to form a protruded shape of the nanotube 130, the surface of the fixing material 120a is precisely ground while the nanotubes 130 are distributed and buried in the fixing material 120a which is the glass layer as illustrated in FIG. 3.

Figure 4:
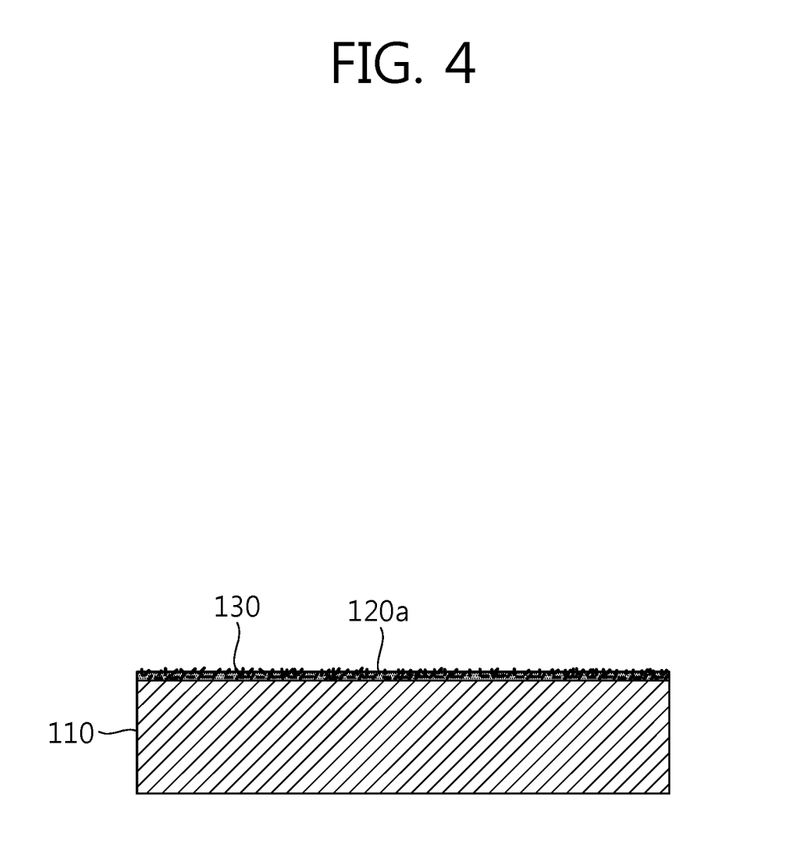

The method for producing the low friction member according to the first embodiment of the present invention, which is configured as such will be described below in detail with reference to FIGS. 2 to 4 which are accompanied.

First, as illustrated in FIG. 2, a step of mixing the low thermal expansive glass powder 120 and the nanotube 130 is performed. To this end, slurry is made by mixing the low thermal expansive glass powder 120 and the nanotube 130 by a wet method. As another available method, the low thermal expansive glass powder 120 and the nanotube 130 are mixed with each other by a dry method and primarily melted and thereafter, cooled and ground and the ground powder is mixed in ethanol to be prepared.

Thereafter, a step of distributing and coating the mixed low thermal expansive glass powder 120 and the nanotube 130 onto the surface of the base material 110 is performed. In this step, mixed slurry of the low thermal expansive glass powder 120 and the nanotube 130 which are made in the previous step is coated to the base material 110 and dried. Even in a case where the low thermal expansive glass powder 120 and the nanotube 130 are mixed with each other by the dry method and cooled and ground and thereafter, the ground powder is mixed in the ethanol to be prepared, such a result is similarly shown.

Thereafter, a step is performed in which the low thermal expansive glass powder 120 covering the surface of the base material 110 is heated and melted and thereafter, cured to form the fixing material 120a in which the nanotube 130 is buried as illustrated in FIG. 3. In this step, the low thermal expansive glass powder 120 is heated at a temperature which belongs to a temperature range of 1300 to 1500° C. for 2 to 10 hours in order to melt the low thermal expansive glass powder 120. When the low thermal expansive glass powder 120 is melted during such a process, the friction coefficient of the surface of the base material 110 is lowered while the melted low thermal expansive glass power 120 leaks in porosities and breakage portions which exist on the surface of the base material 110. Meanwhile, even in a case where the low thermal expansive glass powder 120 and the nanotube 130 are mixed with each other by the dry method and cooled and ground and thereafter, the ground powder is mixed in the ethanol to be coated, such a result is similarly shown.

Thereafter, a step of surface-processing the fixing material 120a so that the nanotube 130 buried in the vicinity of the surface of the fixing material 120a is performed. In this step, the surface of the fixing material 120a in which the nanotube 130 is buried is precisely ground. However, if there is a method that may remove only a part of the surface of the fixing material 120a except for the nanotube 130 in addition to the grinding method, the method may be coated. Then, as illustrated in FIG. 4, the nanotube 130 is exposed while being protruded to the outside of the fixing material 120a.

Thereafter, a step of coating a liquid lubricant onto the surface of the base material 110 is performed. Although not illustrated in FIG. 4, this step may be frequently performed while the low friction member according to the first embodiment of the present invention is used. When even the liquid lubricant is coated onto the surface of the base material 110, the surface friction may be effectively reduced while a friction reduction effect by the melted low thermal expansive glass powder 120 and the friction reduction effect acquired by improvement of fluidity of the liquid lubricant due to a concentration phenomenon of the protruded seaweed-type nanotubes works in combination.

Meanwhile, the low friction member may be manufactured even through a process in which the nanotubes 130 are distributed to sol including borosilicate and soda borosilicate by modifying the aforementioned producing method, the sol to which the nanotubes 130 are distributed is coated to the base material 110 by various coating methods (dip-coating, spin coating, spray coating, and painting), heated at a temperature which belongs to a temperature range of 300 to 300° C. for 20 minutes to 4 hours to form a glass complex and thereafter, the surface is ground.

A low friction member and a method for producing the low friction member according to a second embodiment of the present invention will be continuously described.

Figure 5:
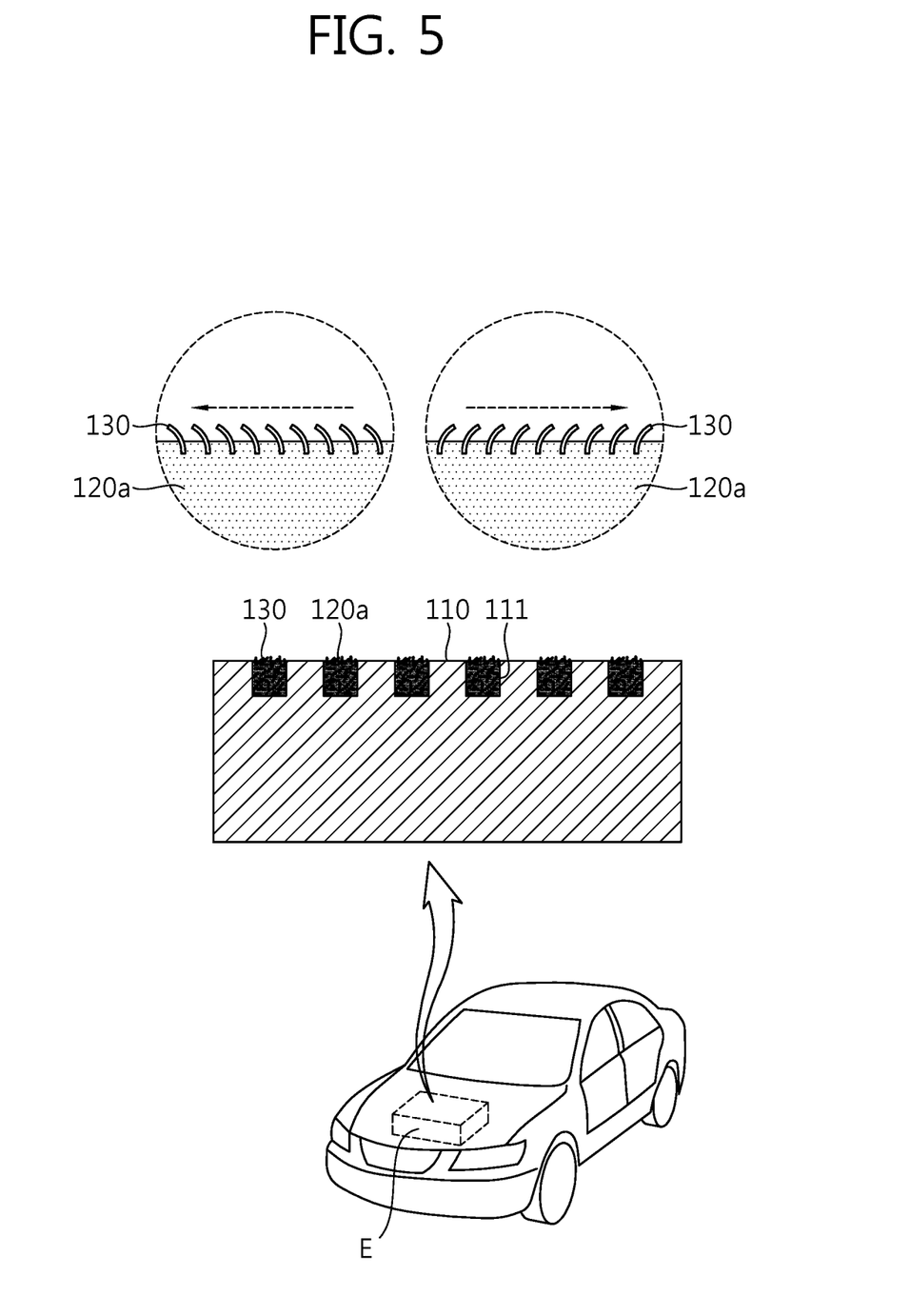
FIG. 5 is a cross-sectional view for describing a configuration of a low friction member according to a second embodiment of the present invention.
Figure 6:
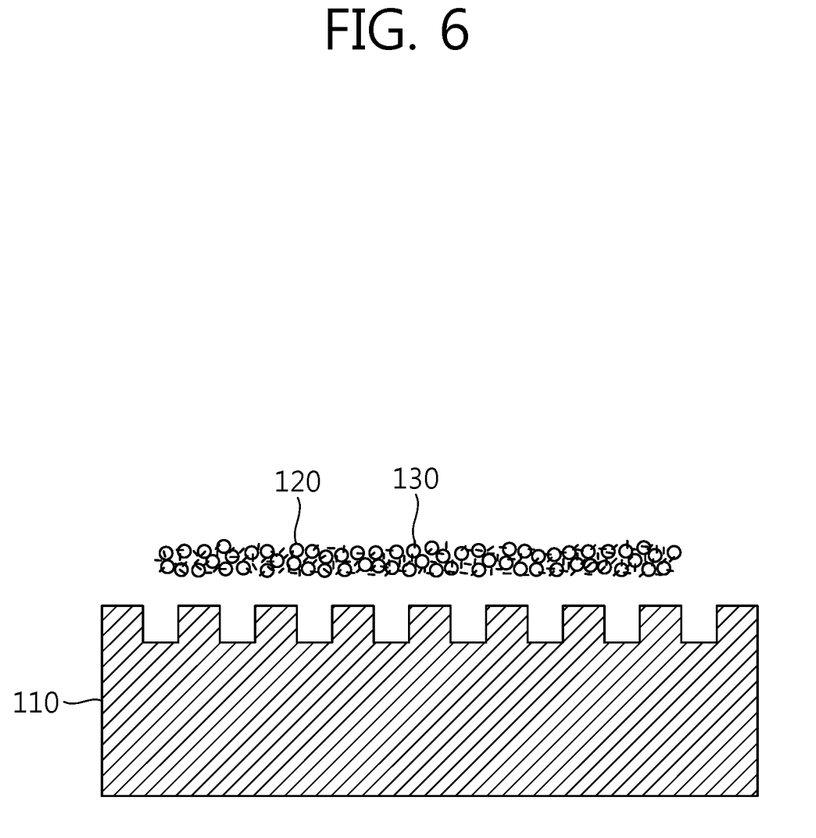
FIGS. 6 to 8 are a series of reference diagrams for describing a method for producing the low friction member according to the second embodiment.
Figure 7:
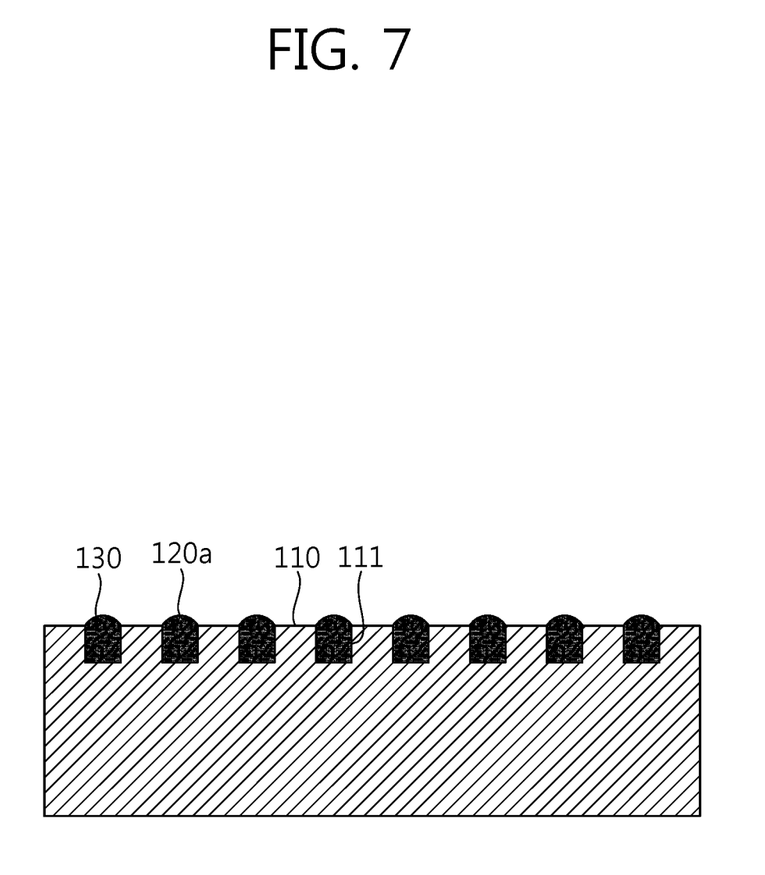
Figure 8:
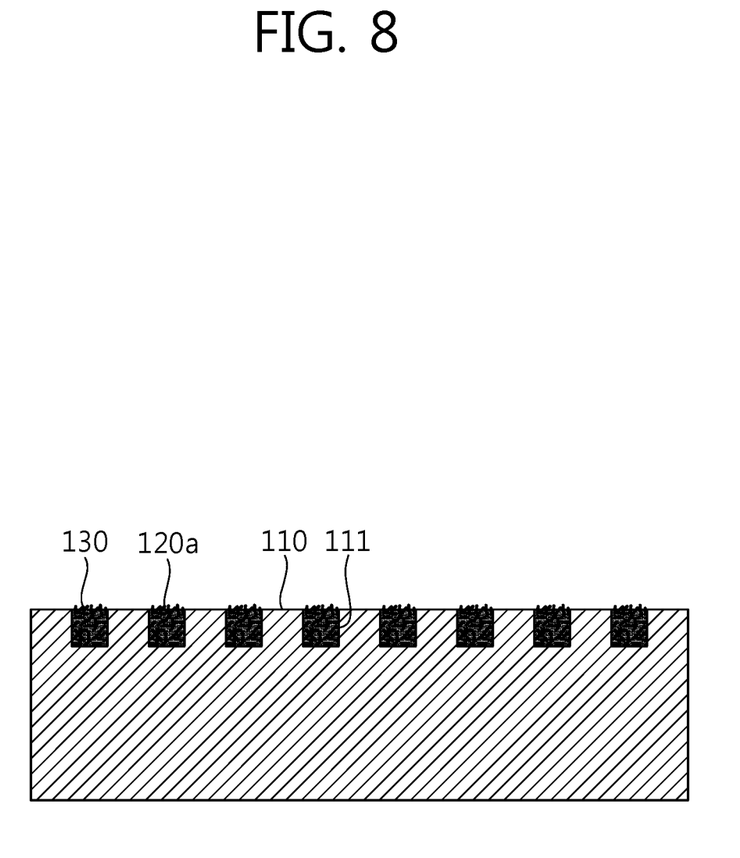

FIG. 5 is a cross-sectional view for describing a configuration of a low friction member according to a second embodiment of the present invention and FIGS. 6 and 8 are a series of reference diagrams for describing a method for producing the low friction member according to the second embodiment of the present invention.

As illustrated, in the case of the low friction member according to the second embodiment of the present invention, a dimple 111 is additionally formed so as to reduce the friction due to a surface-contact with the surface of the base material 110 as compared with the first embodiment.

When the dimple 111 is formed in the base material 110 as such, there is a difference in that it is limited so that the fixing material 120a is filled not on the entirety of the surface of the base material 110 but in the dimple 111 while the nanotube 130 is buried. Since the configuration of the low friction member or the method for producing the low friction member are almost identical to those of the first embodiment except for such a difference, a detailed description thereof will be omitted.

According to the second embodiment, the friction reduction effect by the dimple 111 works instead of the friction reduction effect by the glass layer formed on the surface of the base material 110 and works in combination together with the friction reduction effect acquired by the improvement of the fluidity of the liquid lubricant due to the concentration phenomenon of the protruded seaweed-type nanotube 130.

A low friction member and a method for producing the low friction member according to a third embodiment of the present invention will be continuously described.

Figure 9:
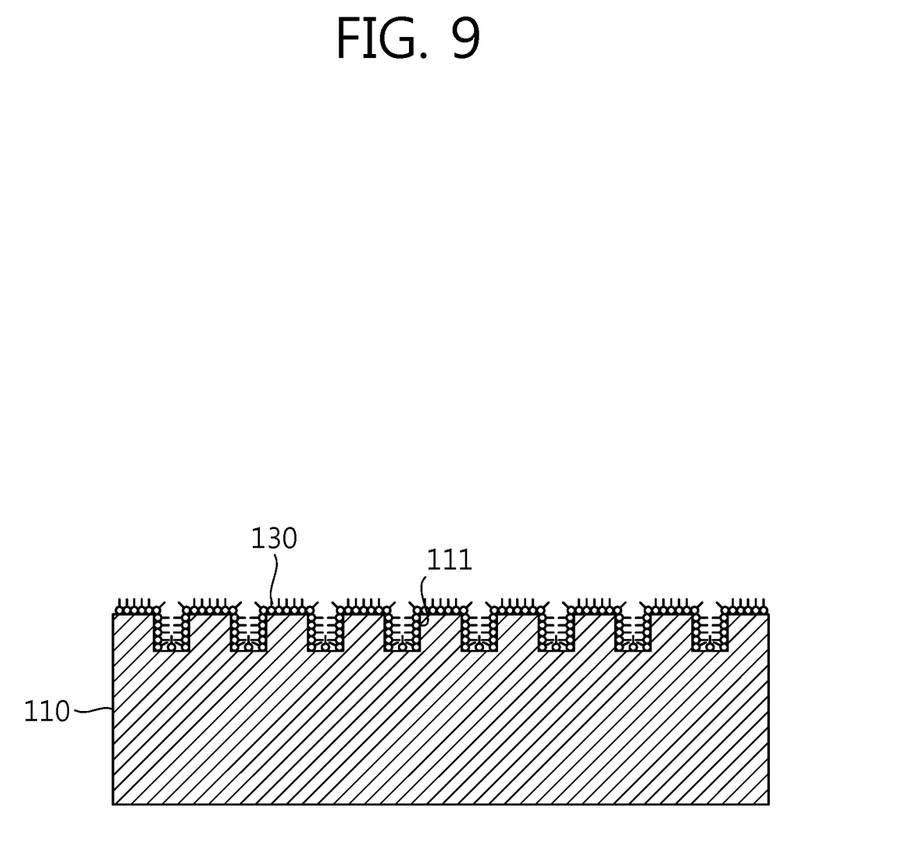
FIG. 9 is a cross-sectional view for describing a configuration of a low friction member according to a third embodiment of the present invention.
Figure 10:
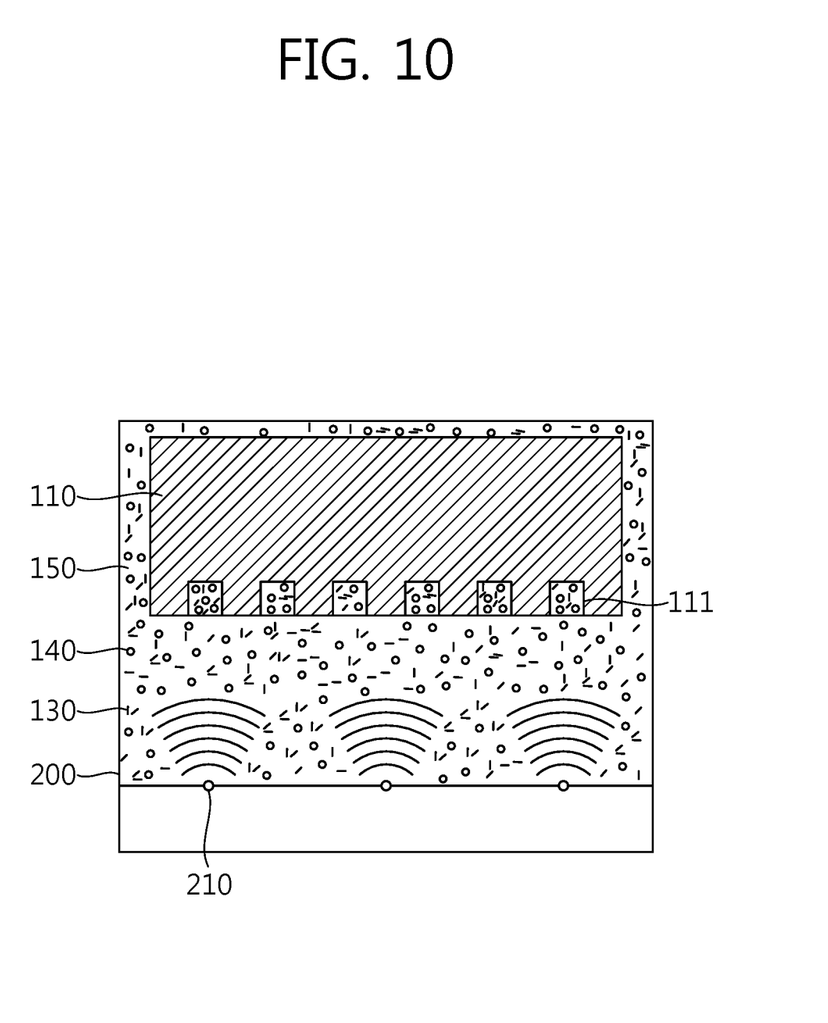
FIGS. 10 and 11 are reference diagrams for describing a part of the method for producing the low friction member according to the third embodiment.
Figure 11:
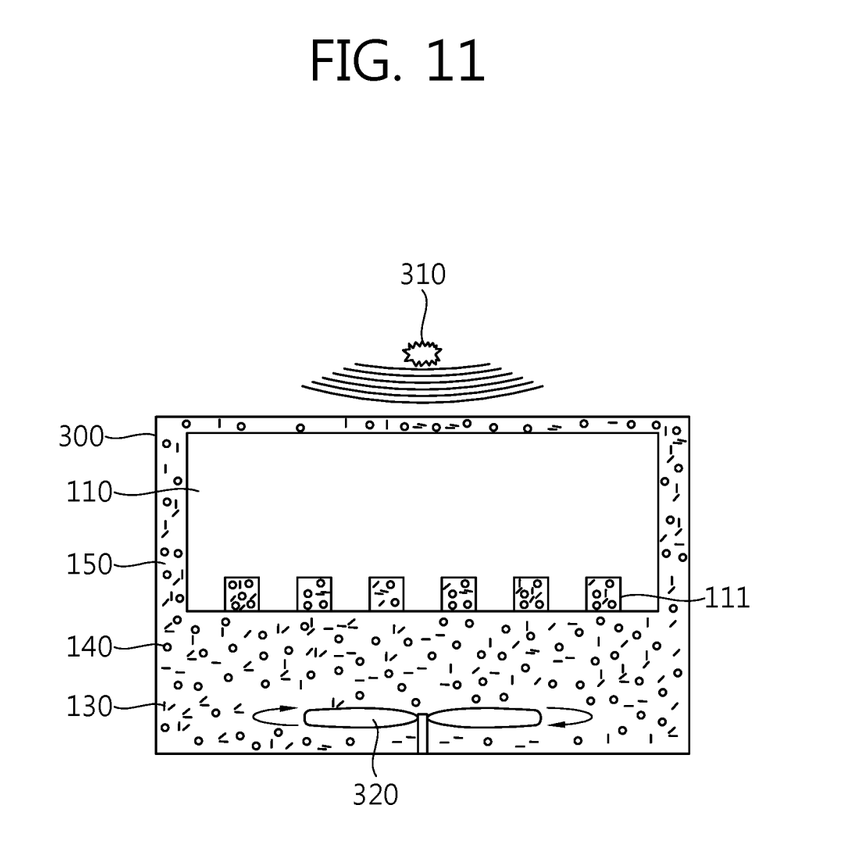

FIG. 9 is a cross-sectional view for describing a configuration of a low friction member according to a third embodiment of the present invention and FIGS. 10 and 11 are reference diagrams for describing a part of a method for producing the low friction member according to the third embodiment of the present invention.

As illustrated, the low friction member according to the third embodiment includes a base material 110 having a patterned dimple 111 formed on the surface thereof, a metallic solid lubrication particle 140 coated onto the surface of the base material 110, and a nanotube 130 provided to protrude on the surface of the metallic solid lubrication particle 140.

According to such a configuration, since the friction reduction effect by the dimple 111, the friction reduction effect by the metallic solid lubrication particle 140, and the friction reduction effect by the nanotube 130 work in combination, a higher friction reduction effect may be expected.

The low friction member in which the metallic solid lubrication particle 140 and the nanotube 130 are provided in combination may be manufactured by various methods and this will be described below.

One method of primary methods for producing the low friction member in which the metallic solid lubrication particle 140 and the nanotube 130 are provided in combination is substantially the same as a method that slurries 150 is made by wet-mixing the metallic solid lubrication particle 140 and the nanotube 130 and coated and cured, and performs heat treatment and surface treatment in order to manufacture the low friction member according to the first embodiment of the present invention.

That is, in the method that manufactures the low friction member in which the metallic solid lubrication particle 140 and the nanotube 130 are provided in combination, a step of making the slurries 150 by wet-mixing the metallic solid lubrication particle 140 and the nanotube 130, a step of distributing and coating the slurries 150 of the metallic solid lubrication particle 140 and the nanotube 130 onto the surface of the base material 110, a step of performing heat-treatment at a temperature which belongs to a temperature range of 800 to 1000° C. for 1 to 2 hours while the metallic solid lubrication particle 140 and the nanotube 130 are coated onto the surface of the base material 110, and a step of performing the surface-processing by methods including grinding, etc., are sequentially performed.

Herein, in the case of a large-area base material 110, an ultrasonic wave generating apparatus may be used as illustrated in FIG. 10. In a method using ultrasonic waves, the slurries 150 including the precursor type metallic solid lubrication particle 140 and the nanotube 130 are contained in an ultrasonic wave generating apparatus 200 in which an oscillator 210 is installed and the large-area base material 110 is immersed in the slurries 150 and thereafter, the ultrasonic waves generated by the oscillator 210 is applied. Then, the precursor type metallic solid lubrication particle 140 and the nanotube 130 repeatedly collide with the base material 110 with strong force while micro-jet made by a collision of acoustic bubbles moves at a high speed (100 m per second or more) and the metallic solid lubrication particle 140 and the nanotube 130 are deposited onto the surface of the base material 110 during such a process. The ultrasonic waves applied in this case has power of 800 to 1200 W, and a frequency of 20 kHz as data for 0.5 to 12 hours. Since the coating method using the ultrasonic wave has less restrictions of shapes and sizes of particles than a general application method which is used in the related art as described above, it is effective to handle the metallic solid lubrication particle 140 having a nano size even with respect to the large-area base material 110.

Further, in the case of the large-area base material 110, an ultraviolet ray irradiating apparatus may be used as illustrated in FIG. 11. In this method, the slurries 150 including the precursor type metallic solid lubrication particle 140 and the nanotube 130 are contained in an ultraviolet ray generating apparatus 300 in which a UV lamp 310 and a stirring wing 320 are installed and immersed in the base material 110 and thereafter, ultraviolet rays are irradiated to the slurries 150. In this case, the UV lamp 310 having a wavelength range of 200 to 400 nm is used in order to irradiate the ultraviolet rays and a distance between the UV lamp 310 and the slurries 150 is fixed as approximately 10 cm. Then, the precursor type metallic solid lubrication particle 140 and the nanotube 130 are deposited onto the surface of the base material 110 and coated through a light reduction process. During such a process, a more rapidly result may be obtained while the stirring wing installed in the ultraviolet ray generating apparatus 300 rotates.

The application method using the ultrasonic waves or ultraviolet rays may be modified according to a situation. That is, a method that makes only the metallic solid lubrication particle 140 be included in the slurries 150 and deposits the slurries 150 onto the base material 110 and thereafter, grows the nanotube 130 such as CNT, etc., by a thermal chemical vapor deposition process using the metallic solid lubrication particle 140 as a catalyst may also be used.

In this case, the metallic solid lubrication particle 140 may be made of any one material of gold, silver, and copper and during producing, gold is obtained from gold precursors including $HAuCl_4$, $HAuCl_4$, $3H_2O$, etc., silver is obtained from silver precursors including $AgNO_3$, silver acetate, $Ag(NH_3)_2^+$, etc., and copper is obtained from copper precursors including $CuSO_4$, $CuCl_2$, $Cu(AOT)_2$, $Cu(NO_3)_2$, $Cu(acac)_2$, etc. Further, in order to grow the nanotube 130 by the chemical vapor deposition process, as mixed gas, (a) $CH_4$ (or $C_2H_4$ or $C_2H_2$): 20 to 50 sccm, (b) $H_2$: 20 to 100 sccm, (c) Ar (or He or $N_2$): 20 to 500 sccm are used and heated at a temperature which belongs to a temperature range of 700 to 1000° C. for 5 to 60 minutes.

Of course, such a condition may vary according to a difference in dissolution depending on the catalyst.

Further, a method that applies the metallic solid lubrication particle 140 to the base material 110 by spin-coating, spray coating, and painting by considering a random shape, applies the metallic solid lubrication particle 140 to the base material 110 by screen printing or inkjet printing by considering a specific shape, and thereafter, grows the nanotube 130 by the chemical vapor deposition process described above by using the coated metallic solid lubrication particle 140 as the catalyst may also be used. Herein, when the metallic solid lubrication particle 140 is coated on the base material 110 as described above, the metallic solid lubrication particle 140 is heated at a temperature of 300 to 500° C. for 1 to 2 hours under an inert gas atmosphere prior to the chemical vapor deposition process.

Preferred embodiments of the present invention are described as above, but various changes, modifications, and equivalents may be used in the present invention. It is clear that the embodiments may be appropriately modified and similarly applied in the present invention. Accordingly, the disclosed contents do not limit the scope of the present invention defined by a limit of the claims.

The invention claimed is:

1. A low friction member having seaweed-type nanotubes, comprising:
    a base material which has a plurality of dimples formed on the surface thereof so as to reduce friction occurring due to the surface contact of a sliding member;
    a fixing material which is filled inside the dimples;
    nanotubes which are buried in the fixing material and protrude to the outside by means of the surface processing of the fixing material; and
    a liquid lubricant which is coated on the surface of the base material,
    wherein, as the protruding nanotubes become concentrated in the moving direction of the sliding member, the fluidity of the liquid lubricant is improved, thereby enabling the effective reduction of surface friction.

2. The low friction member having seaweed-type nanotubes of claim 1, wherein the fixing material is formed by melting and thereafter, curing glass powder and the nanotubes are mixed while being distributed to the glass powder at the time of forming the fixing material.

3. A method for producing a low friction member, comprising:
    mixing low thermal expansive glass powder and nanotubes;
    distributing and coating the mixed low thermal expansive glass powder and nanotubes onto the surface of a base material;
    heating and melting, and thereafter, curing the low thermal expansive glass powder covering the surface of the base material to form a fixing material in which the nanotubes are buried;
    surface-processing the fixing material so that the nanotube buried in the vicinity of the surface of the fixing material protrudes; and
    coating a liquid lubricant on the surface of the base material.

4. The method for producing a low friction member of claim 3, wherein a patterned low friction dimple is formed on the surface of the base material.

5. The method for producing a low friction member of claim 4, wherein the fixing material is provided to be filled in the dimple.

6. The method for producing a low friction member of claim 3, wherein the low thermal expansive glass powder and the nanotubes are coated on the surface of the base material in a type of slurries acquired by mixing the low thermal expansive glass powder and the nanotubes by a wet method, and
    the low thermal expansive glass powder is heated at a temperature which belongs to a temperature range of 1300 to 1500° C. for 2 to 10 hours in order to melt the low thermal expansive glass powder and the melted glass powder is filled in breakage portions which exist on the surface of the base material.

7. The method for producing a low friction member of claim 3, further comprising:
    primarily melting, cooling, and grinding the low thermal expansive glass powder and the nanotubes;
    mixing ground powder made through the grinding in ethanol and coating the ground powder on the base material; and
    heating the low thermal expansive glass powder at a temperature which belongs to a temperature range of 1300 to 1500° C. for 2 to 10 hours in order to secondarily melt the low thermal expansive glass powder to make the melted low thermal expansive glass power form a layer on the surface of the base material while the melted low thermal expansive glass powder is filled in the breakage portions which exist on the surface of the base material.

8. A method for producing a low friction member, comprising:
    mixing a metallic solid lubrication particle and nanotubes;
    distributing and coating the mixed metallic solid lubrication particle and nanotubes onto the surface of a base material;
    performing heat-treatment while the metallic solid lubrication particle and nanotubes are coated on the surface of the base material; and
    surface-processing the surface of the base material.

9. The method for producing a low friction member of claim 8, wherein in order to coat the metallic solid lubrication particle and nanotubes on the surface of the base material, slurries including the metallic solid lubrication particle and nanotubes are provided and ultrasonic waves are applied while the base material is immersed in the slurries.

10. The method for producing a low friction member of claim 8, wherein in order to coat the metallic solid lubrication particle and nanotubes on the surface of the base material, the slurries including the metallic solid lubrication particle and nanotubes are provided and ultraviolet rays having a wavelength range of 200 to 400 nm are irradiated while the base material is immersed in the slurries.

11. The method for producing a low friction member of claim 8, wherein a patterned low friction dimple is formed on the surface of the base material.

* * * * *